US006744682B2

(12) United States Patent
Morgan

(10) Patent No.: US 6,744,682 B2
(45) Date of Patent: Jun. 1, 2004

(54) SEMICONDUCTOR MEMORY WITH JOINTLY USABLE FUSES

(75) Inventor: Alan Morgan, Stockton-on-Tees (GB)

(73) Assignee: Infineon Technologies AG, Munich (DE)

( * ) Notice: Subject to any disclaimer, the term of this patent is extended or adjusted under 35 U.S.C. 154(b) by 72 days.

(21) Appl. No.: 10/153,766

(22) Filed: May 22, 2002

(65) Prior Publication Data

US 2003/0036226 A1 Feb. 20, 2003

(30) Foreign Application Priority Data

May 22, 2001 (DE) .......................................... 101 25 028

(51) Int. Cl.$^7$ ............................................. G11C 29/00
(52) U.S. Cl. ........................ 365/201; 365/201; 365/200
(58) Field of Search ................................. 365/201, 200, 365/230.03, 230.06, 225.7; 371/10.2, 10.03

(56) References Cited

U.S. PATENT DOCUMENTS 5,859,804 A * 1/1999 Hedberg et al. ............ 365/201
6,205,063 B1   3/2001 Aipperspach et al. ....... 365/200

* cited by examiner

Primary Examiner—David Nelms
Assistant Examiner—Thinh T Nguyen
(74) Attorney, Agent, or Firm—Fish & Richardson, PC

(57) ABSTRACT

A semiconductor memory apparatus includes a first and second memory bank. Each of these memory banks has a plurality of row and column lines and at least one redundant column line. An activation device selectively activates the redundant column line, thereby causing the redundant column line to become a replacement line for a defective column line. The activation device includes a plurality of programmable addressing fuses, and a programmable selection fuse having at least two electrical selection fuse states. The programmable selection fuse is configured such that an addressing fuse in the first selection fuse state is electrically associated with the first memory bank and an addressing fuse in the second selection fuse state is electrically associated with the second memory bank.

15 Claims, 2 Drawing Sheets

SEMICONDUCTOR MEMORY WITH JOINTLY USABLE FUSES

FIELD OF INVENTION

This invention relates to the repair of semiconductor memory.

RELATED APPLICATIONS

This application claims the benefit of the May 22, 2001 priority date of German application 101 25 028.2-53, the contents of which are herein incorporated by reference.

BACKGROUND

Semiconductor memory apparatuses which, within certain limits, allow faulty column lines (that is to say data lines or bit lines) to be repaired, are known. For this purpose, the cell array of such a semiconductor memory apparatus contains redundant column lines, which can be used as replacement lines for defective column lines. If a defective column line is found in a test procedure after production of the semiconductor apparatus, then an activation device which is integrated in the semiconductor memory apparatus is activated, in order to replace the defective column line by one of the redundant column lines. Such activation devices normally include a large number of addressing fuses, which are also referred to as column redundancy fuses. Addressing fuses such as these can be "progammed", for example by applying an electrical voltage or by means of a laser, as function of the electrical address of the faulty column line, by blowing the fuses. A so-called master fuse is normally also programmed, in order to activate the redundant column line.

If access is now made to that memory cell array of the semiconductor memory apparatus whose electrical address has the faulty column line, then a logic gate in the activation device ensures that the redundant column line is addressed instead of the defective column line. A semiconductor memory apparatus which has been repaired in this way behaves, for the user, like a semiconductor memory apparatus which has been fault-free from the start. The use of redundant column lines for repairing defective column lines in conjunction with such an activation device thus allows a greater yield from the production of semiconductor memory apparatuses, since defective column lines can, within certain limits, be repaired.

However, the addressing fuses require a certain amount of surface area on the semiconductor memory apparatus, so that the chip size of such components is larger than that of those without a repair capability. The advantage of a greater yield is thus a trade-off against an increased chip surface area.

SUMMARY

One object of the invention is to specify a semiconductor memory apparatus having a column repair capability, which requires only a comparatively small chip size. A further object of the invention is to specify a corresponding repair method for semiconductor memory apparatuses.

According to the invention, these objects are achieved by a semiconductor memory apparatus according to claim 1, and by a repair method for a semiconductor memory apparatus according to claim 11. Preferred embodiments are the subject matter of the dependent claims.

According to the invention, a semiconductor memory apparatus has:

- at least one first and one second memory bank, which each have a large number of row and column lines and at least one redundant column line,
- an activation device, which is designed for activation of the redundant column lines as replacement lines for defective column lines, and has a large number of programmable addressing fuses (column redundancy fuses) and at least one programmable selection fuse (enable fuse) with at least two electrical selection fuse states,
- with the selection fuse being designed such that at least one of the addressing fuses in the first selection fuse state is electrically associated with the first memory bank and in the second selection fuse state is electrically associated with the second memory bank, in order to activate the respective redundant column line.

The invention proposes that two memory banks in the semiconductor memory apparatus according to the invention have the capability to "divide up" the addressing fuses that are provided. The at least one selection fuse is provided in the activation device for this purpose, via which an addressing fuse can be associated with either the first memory bank or the second memory bank. Existing addressing fuses can thus be used both in conjunction with the first memory bank and in conjunction with the second memory bank.

In conventional semiconductor memory apparatuses, no such selectable association is possible between addressing fuses and either the first or the second memory bank. Instead of this, conventional semiconductor memory apparatuses with a number of memory banks each have addressing fuses which are permanently associated with specific memory banks. In consequence, in known semiconductor memory apparatuses, one addressing fuse can be used only in conjunction with a memory bank which is permanently associated with it.

The semiconductor memory apparatus according to the invention in contrast has greater repair flexibility while having the same number of fuses, so that the production yield of such components can be increased. In other words, in comparison to a conventional semiconductor memory apparatus, fewer addressing fuses need to be provided in the semiconductor memory apparatus according to the invention, for a predetermined maximum number of possible repair options, so that the chip size of the semiconductor memory apparatus according to the invention can be reduced in comparison to that of the conventional semiconductor memory apparatus. Equally, it is possible to use the selection fuse to associate the at least one addressing fuse with any given memory bank, when more than two memory banks are provided in the semiconductor memory apparatus.

According to one preferred embodiment, the first selection fuse state corresponds to an electrically nonconductive state, and the second selection fuse state corresponds to an electrically conductive state. The programming of the selection fuse, which is thus equivalent to (reversible or irreversible) fixing of the selection fuse state, thus includes fixing of this state as a nonconductive state or as a conductive state. However, it is equally possible to associate a conductive state with the first selection fuse state, and a nonconductive state with the second selection fuse state.

According to one particularly preferred embodiment, at least one first and one second selection fuse are provided, with at least one of the addressing fuses being associated with the first memory bank when the first selection fuse is in the first selection fuse state and the second selection fuse is in the second selection fuse state. In contrast, this addressing fuse is then associated with the second memory bank when the first selection fuse is in the second selection fuse state and the second selection fuse is in the first selection fuse state, The association or fixing of the at least one addressing fuse with the first or the second memory bank is accordingly preferably carried out by means of two selection fuses. If the first selection fuse is in the first selection fuse state (for example an electrically nonconductive state) and the second selection fuse is in the second selection fuse state (for example an electrically conductive state), then the at least one addressing fuse is associated with the first memory bank. Programming of the addressing fuse can thus be used to repair a faulty column line in the first memory bank, by using a redundant column line, which is provided in the first memory bank, to replace this faulty column line. If the selection fuse states are interchanged in comparison to the state described above, then the addressing fuse is associated with the second memory bank.

The addressing fuses and/or the selection fuses are preferably fuses which can be blown by laser and/or electrically. Such a fuse which can be blown by laser allows (irreversible) programming, that is to say fixing of the fuse state, in which a focused laser beam interrupts, for example, a metal track in the fuse. Electrically programmable fuses can be changed to a specific fuse state irreversibly, or reversibly by applying an electrical voltage to the fuse. Such electrically programmable fuses may, for example, have a construction such as that which is known from PROM memory concepts.

According to a further preferred embodiment, the at least one selection fuse is designed for electrical association of one group of the addressing fuses with one of the memory banks. The selection fuse can thus be programmed to electrically associate an entire group of addressing fuses with either the first memory bank or the second memory bank.

The large number of addressing fuses preferably forms an addressing fuse bank. Such an addressing fuse bank may preferably include a number of groups of addressing fuses, for example arranged linearly, in which case each such group can be programmed as a function of an electrical address of a defective column line in one of the memory banks. While, in the case of conventional semiconductor memory apparatuses with a repair capability, a dedicated addressing fuse bank had to be provided for each memory bank and was permanently associated with this memory bank, the invention makes it possible to use only a single addressing fuse bank. It is possible to use the at least one selection fuse to decide whether the addressing fuse bank or a group of the addressing fuses in this bank should be associated with the first or the second memory bank. The addressing fuse bank is preferably arranged between the memory banks. This allows the semiconductor memory apparatus to be designed in a space-saving manner.

According to one preferred embodiment, each of the memory banks has a large number of redundant column lines. In comparison to the addressing fuses and selection fuses, the redundant column lines in the memory banks occupy relatively little chip surface area. It is thus possible to provide a large number of redundant column lines in each memory bank without having to significantly enlarge the semiconductor memory apparatus. The minimum necessary chip surface area for a semiconductor memory apparatus with a repair capability, in comparison to such an apparatus without a repair capability, is accordingly not governed by the additional redundant column lines, but primarily by the fuses that are additionally required. It has been found to be advantageous to arrange the column lines such that they are distributed in the memory banks, According to one particularly preferred embodiment, the memory banks are DRAM memory banks, in particular SDRAM memory banks.

According to the invention, a repair method for a semiconductor memory apparatus comprises the following steps:

provision of the semiconductor memory apparatus with at least one first and one second memory bank, which each have a large number of row and column lines and at least one redundant column line, with the semiconductor apparatus having an activation device which is designed for activation of the redundant column line as a replacement line for a defective column line;

identification of a memory bank number of that memory bank which has the defective column line;

identification of an electrical address for the faulty column line;

programming of at least one addressing fuse of the activation device as a function of the identified address;

programming of at least one selection fuse of the activation device as a function of the identified memory bank number;

with the programming of the selection fuse electrically associating the addressing fuse with the memory bank with the identified memory bank number, so that the faulty column line is replaced by the redundant column line.

Accordingly, in the method according to the invention, the semiconductor memory apparatus is first of all checked for any faulty column lines. If such a column line has been found, then the method identifies the memory bank in which the faulty column line is located, and which electrical address is associated with it. This information is then used to program the activation device in a suitable manner. The programming is carried out by fixing (irreversibly or reversibly) the states of addressing and selection fuses. The address information for the faulty column line is used for programming the addressing fuse or the addressing fuses, so that, when the memory cell array is subsequently accessed, the faulty column line is not addressed but rather a redundant column line which replaces it.

Since the addressing fuse or the addressing fuses may be associated with both the first memory bank and the second memory bank, it is necessary to determine by programming of the at least one selection fuse the memory bank for which the programmed addressing fuses are intended to be used. The at least one selection fuse is thus programmed as a function of the memory bank number which contains the faulty column line. Programming of the fuses is equivalent to fixing the fuse state, for example by blowing a fuse by means of a laser. The programming of the intended selection fuse advantageously makes it possible for the first and the second memory bank to "share" at least one addressing fuse. It is thus possible to reduce the required total number of addressing fuses for a predetermined number of repair options. According to one preferred embodiment of the repair method according to the invention, one group of addressing fuses is programmed as a function of the identified address, with the group in the memory bank being electrically associated with the identified memory bank number by programming of the at least one selection fuse. It is thus possible to electrically associate an entire group of addressing fuses with either the first memory bank or the second memory bank, by programming one selection fuse.

The addressing fuses and/or selection fuses are preferably programmed electrically and/or by means of a laser.

The invention will be described in the following text by way of example using attached drawings, in which:

DESCRIPTION

Figure 1A:
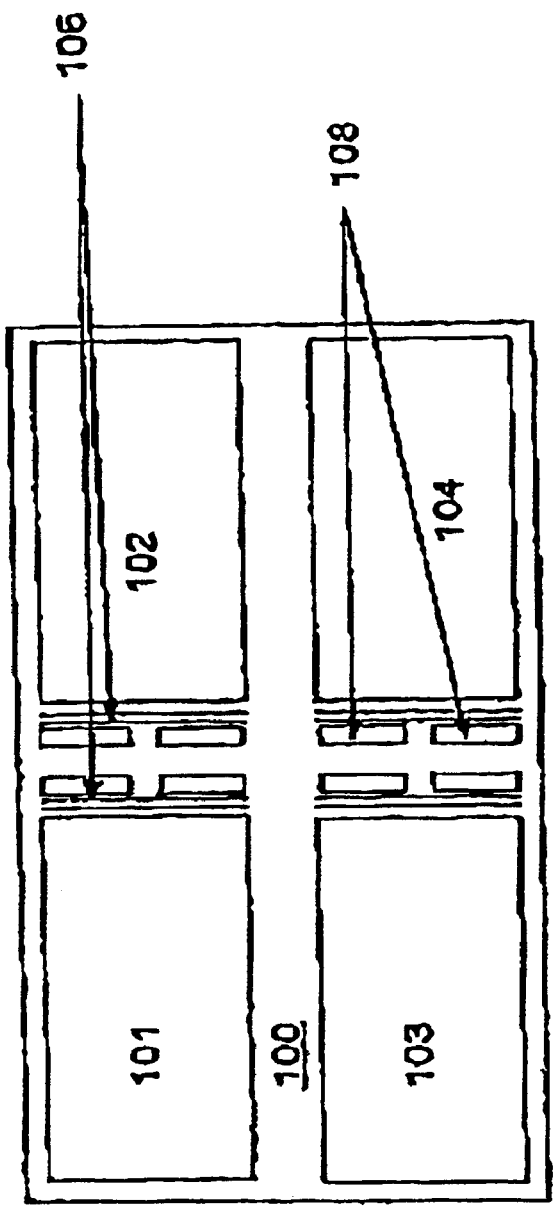
FIG. 1(a) shows a conventional semiconductor memory apparatus having four memory banks and eight fuse banks.

FIG. 1(a) shows a conventional semiconductor memory apparatus 100. The semiconductor memory apparatus 100 has four memory banks, which are annotated 101 to 104. The memory banks 101 to 104 are so-called DDR-SDRAMs which—in order to save chip surface area—each use read/write data lines (RWDLs) 106, which are in each case used jointly in pairs. Each of the memory banks 101 to 104 has (not illustrated) redundant column lines, which are distributed between the respective memory banks or in them.

In order to make it possible to use the redundant column lines as replacement lines for defective column lines, an activation device is provided, which has a large number of programmable fuses. The fuses are in this case grouped in fuse banks 108, with each memory bank being associated with two, and only two, fuse banks. The jointly used RWDLs 106 result in there being a gap between the two fuse banks 108 in each memory bank 101 to 104, in which interconnects are arranged. In other memory bank architectures, however, it is possible to use a single fuse bank for each memory bank, which then preferably runs over the entire width or height of the memory bank.

In order to repair a defective column line in a memory bank 101 to 104, the address information for the defective column line is used for programming a group of addressing fuses (a so-called fuse string). The defective column line is repaired, that is to say the defective column line is electrically replaced by the redundant column line, by programming an additional master fuse. When a memory bank which is being repaired in this way is addressed using an electrical address which represents a "repaired" address, then the (programmed) activation device results in the redundant column line, which replaces the defective column line, being accessed instead of accessing the defective column line. However, in comparison to the redundant column lines that are provided, the fuse banks 108 occupy a relatively large chip surface area, so that a conventional semiconductor memory apparatus of this type is relatively large.

Figure 1B:
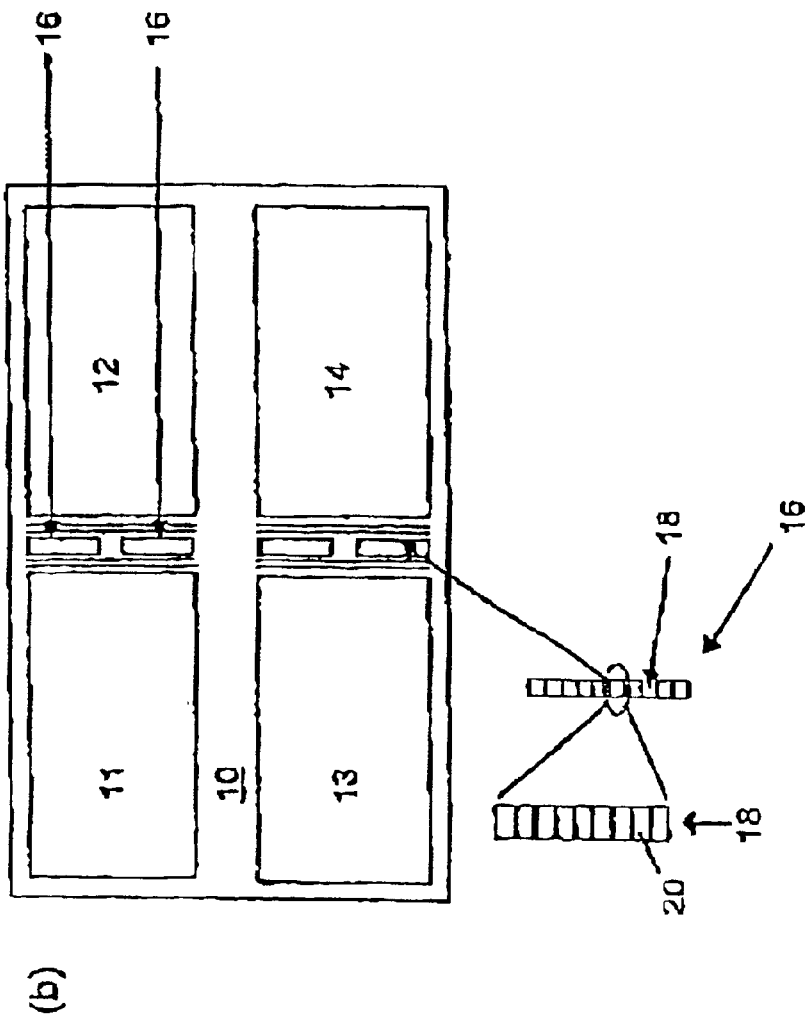
FIG. 1(b) shows an embodiment of a semiconductor memory apparatus according to the invention, having four memory banks and four fuse banks.

FIG. 1(b) shows an embodiment of a semiconductor memory apparatus 10 according to the invention. The semiconductor memory apparatus 10 has four memory banks 11 to 14, which are each arranged in pairs. Each pair of memory banks, that is to say the memory banks 11 and 12 as well as the memory banks 13 and 14, share two fuse banks 16. However, there is no need to use two fuse banks 16 interrupted in the centre. Instead of this, by way of example, it is also possible to use a single fuse bank 16 for each pair of memory banks, or one fuse bank for all four memory banks. The fuse banks 16 have a large number of addressing fuses, which are arranged in groups 18. Each of these groups 18 of addressing fuses can be electrically associated with either the left-hand memory bank or the right-hand memory bank by the programming of two selection fuses. The addressing fuses in the fuse banks 16 which are arranged between the memory banks 11 and 12 can thus be used not only with the left-hand memory bank 11 but also with the right-hand memory bank 12.

FIG. 1(b) shows the layout of a fuse bank 16, enlarged. Each fuse bank 16 contains a row of groups 18 of addressing fuses, with each group 18 being designed for programming the address information for a faulty column line. Each group 18 of addressing fuses accordingly contains a predetermined number of individual addressing fuses 20.

Some of these groups 18 of addressing fuses 20 can optionally be associated by means of selection fuses (not illustrated) either with the left-hand memory bank or with the right-hand memory bank of a pair of memory banks. Other groups 18 can be permanently associated with a predetermined memory bank, in the conventional manner. Two selection fuses which can be blown by laser are provided for each group 18 of addressing fuses 20, which may be used not only with the left-hand memory bank but also with the right-hand memory bank. Blowing the first selection fuse results in the group 18 being associated with the first (for example the left-hand) memory bank, while blowing the second selection fuse results in the group 18 being electrically associated with the second (for example the right-hand) memory bank.

If the testing of the memory banks results in a different number of faults in the left-hand memory bank than in the right-hand memory bank, that is to say the faults are distributed asymmetrically, then—within predetermined limits—the selectable association of the groups 18 of addressing fuses 20 thus nevertheless allows all the faults to be repaired if such defective column line asymmetry were to occur in a pair of memory banks in a conventional semiconductor memory apparatus, then, with the same number of groups of addressing fuses, it would in some circumstances be impossible to repair all the faults, since a group which is associated with the memory bank having few faults cannot be used for the memory bank having a large number of faults.

I claim:

1. A semiconductor memory apparatus comprising:
   at least one first memory bank and at least one second memory bank, each of the first and second memory banks having
   a plurality of row and column lines, and
   at least one redundant column line,
   an activation device for selectively activating the redundant column line, thereby causing the redundant column line to become a replacement line for a defective column line, the activation device including
   a plurality of programmable addressing fuses, and
   a programmable selection fuse having at least two electrical selection fuse states, the programmable selection fuse being configured such that
   an addressing fuse in the first selection fuse state is electrically associated with the first memory bank and
   an addressing fuse in the second selection fuse state is electrically associated with the second memory bank.

2. The semiconductor memory apparatus of claim 1, wherein the first selection fuse state corresponds to an electrically non-conductive state and the second selection fuse state corresponds to an electrically conductive state.

3. The semiconductor memory apparatus of claim 1, further comprising a first selection fuse and a second selection fuse, and wherein
   at least one addressing fuse is associated with the first memory bank when the first selection fuse is in the first selection fuse state and the second selection fuse is in the second selection fuse state, and at least one addressing fuse is associated with the second memory bank when the first selection fuse is in the second selection fuse state and the second selection fuse is in the first selection fuse state.

4. The semiconductor memory apparatus of claim 1, wherein the addressing fuses are configured to be blown by an energy source selected from the group consisting of laser radiation and electrical current.

5. The semiconductor memory apparatus of claim 1, wherein the selection fuses are configured to be blown by an energy source selected from the group consisting of laser radiation and electrical current.

6. The semiconductor memory apparatus of claim 1, wherein the selection fuse is configured to electrically associate a group of addressing fuses with one of the first and second memory banks.

7. The semiconductor memory apparatus of claim 1, further comprising an addressing fuse bank that includes a plurality of the addressing fuses.

8. The semiconductor memory apparatus of claim 7, wherein the addressing fuse bank is disposed between the first and second memory banks.

9. The semiconductor memory apparatus of claim 1, wherein each of the first and second memory banks comprise a plurality of redundant column lines.

10. The semiconductor memory apparatus of claim 9, wherein the redundant column lines are distributed among a plurality of first and second memory banks.

11. The semiconductor memory apparatus of claim 1, wherein the first and second memory banks comprise DRAM memory banks.

12. A method for repairing a semiconductor memory apparatus, the method comprising:

providing a semiconductor memory apparatus having
at least one first memory bank and at least one second memory bank, each of the first and second memory banks having a plurality of row and column lines, and at least one redundant column line, and
an activation device for selectively activating the redundant column line, thereby causing the redundant column line to become a replacement line for a defective column line;

identifying a memory bank having a defective column line;

identifying an electrical address of the defective column line;

programming an addressing fuse associated with the address of the defective column line; and programming a selection fuse associated with the identified memory bank having the defective column line to associate the addressing fuse with the memory bank thereby causing the defective column line to be replaced by the redundant column line.

13. The method of claim 12, further comprising programming a group of addressing fuses associated with the identified address, the group being electrically associated with the identified memory bank by programming of the selection fuse.

14. The method of claim 12, wherein programming an addressing fuse comprises applying to the addressing fuse energy selected from an energy source selected from the group consisting of laser radiation and electrical current.

15. The method of claim 12, wherein programming a selection fuse comprises applying to the addressing fuse energy selected from an energy source selected from the group consisting of laser radiation and electrical current.

* * * * *